US011212951B2

United States Patent
Kondo et al.

(10) Patent No.: US 11,212,951 B2
(45) Date of Patent: Dec. 28, 2021

(54) COMPONENT MOUNTING SYSTEM

(71) Applicant: FUJI CORPORATION, Chiryu (JP)

(72) Inventors: Masahiro Kondo, Kasugai (JP);
Shingo Fujimura, Toyoake (JP);
Mizuho Yamamoto, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 102 days.

(21) Appl. No.: 16/497,974

(22) PCT Filed: Mar. 29, 2017

(86) PCT No.: PCT/JP2017/012945
§ 371 (c)(1),
(2) Date: Sep. 26, 2019

(87) PCT Pub. No.: WO2018/179147
PCT Pub. Date: Oct. 4, 2018

(65) Prior Publication Data
US 2021/0112692 A1 Apr. 15, 2021

(51) Int. Cl.
*H05K 13/04* (2006.01)
*H04B 10/114* (2013.01)
*H05K 13/08* (2006.01)

(52) U.S. Cl.
CPC ..... *H05K 13/0452* (2013.01); *H04B 10/1141* (2013.01); *H05K 13/086* (2018.08); *H05K 13/0882* (2018.08)

(58) Field of Classification Search
CPC ............. H05K 13/086; H05K 13/0882; H04K 13/0452
See application file for complete search history.

(56) References Cited

U.S. PATENT DOCUMENTS 5,193,268 A    3/1993  Ono et al.
5,267,173 A *  11/1993 Tanizawa ............. G05D 1/0261
                                           700/229
(Continued)

FOREIGN PATENT DOCUMENTS

EP    2 874 481 A1    5/2015
EP      2874481 A1 *  5/2015  ........... H05K 13/086
(Continued)

OTHER PUBLICATIONS

Chen et al., Cost-Effective Comparison of Coupler Designs of Wireless Power Transfer for Electric Vehicle Dynamic Charging, 2016 (Year: 2016).*

(Continued)

*Primary Examiner* — Jai M Lee
(74) *Attorney, Agent, or Firm* — Oblon, McClelland, Maier & Neustadt, L.L.P.

(57) ABSTRACT

A component mounting system includes: a mounting line in which multiple component mounting machines, each including a component supply device, are arranged in a predetermined direction; a mobile work device, moving along the predetermined direction, which at least replenishes each of the component mounting machines with the component supply device or recovers the component supply device from each of the component mounting machines, and a management device transmits a signal to the mobile work device via a communication path. The communication path is an optical wireless communication path provided along the predetermined direction.

8 Claims, 6 Drawing Sheets

(56) References Cited

U.S. PATENT DOCUMENTS

| | | | | |
|---|---|---|---|---|
| 6,002,650 | A * | 12/1999 | Kuribayashi | H05K 13/0882 |
| | | | | 700/117 |
| 7,957,822 | B2 * | 6/2011 | Morita | H05K 13/0888 |
| | | | | 700/56 |
| 10,181,250 | B2 * | 1/2019 | Yamamoto | G08B 21/185 |
| 10,182,520 | B2 * | 1/2019 | Shibata | G05B 19/418 |
| 10,205,554 | B2 * | 2/2019 | Kanai | H04J 3/08 |
| 10,216,159 | B2 * | 2/2019 | Tsuji | G07C 3/04 |
| 10,561,050 | B2 * | 2/2020 | Iisaka | H05K 13/0857 |
| 2002/0150448 | A1 * | 10/2002 | Mizokawa | H01L 21/67161 |
| | | | | 414/217 |
| 2015/0280820 | A1 * | 10/2015 | Breuer | H04B 10/40 |
| | | | | 398/128 |
| 2016/0260158 | A1 * | 9/2016 | High | G01S 1/70 |
| 2017/0061365 | A1 * | 3/2017 | Nonoyama | H05K 13/02 |
| 2018/0242485 | A1 * | 8/2018 | Kondo | H05K 13/0452 |

FOREIGN PATENT DOCUMENTS

| | | |
|---|---|---|
| EP | 3 419 403 A1 | 12/2018 |
| JP | 3-153098 A | 7/1991 |
| JP | 7-228481 A | 8/1995 |
| JP | 2003-76422 A | 3/2003 |
| WO | WO 2014/010083 A1 | 1/2014 |
| WO | WO 2014/010084 A1 | 1/2014 |
| WO | WO 2017/033268 A1 | 3/2017 |

OTHER PUBLICATIONS

Saini et al., High Speed Broadband Communication System for Moving Trains using Free Space Optics, (Year: 2016).*

International Search Report dated Jun. 20, 2017 in PCT/JP2017/012945 filed on Mar. 29, 2017.

* cited by examiner

COMPONENT MOUNTING SYSTEM

TECHNICAL FIELD

This description discloses a component mounting system.

BACKGROUND ART

There is known a component mounting system including a replenishing device for replenishing or collecting a component supply device to and from multiple component mounting machines arranged in a mounting line (for example, patent literature 1). This replenishing device can run along the mounting line. The replenishing device is configured to transmit information to the mounting machines without contacting them and is controlled to move to a component mounting machine that needs component replenishment. Components are managed by a management computer.

PATENT LITERATURE

Patent Literature 1: International Publication No. WO 2014/010083

BRIEF SUMMARY

Technical Problem

However, since the replenishing device and the management computer cannot communicate directly with each other, the management computer cannot issue a command directly to the replenishing device. In addition, in a case of an attempt being made for the replenishing device and the management computer to communicate with each other directly, the replenishing device and the management computer may be connected together by a cable stored in a Cableveyor™, however, in that case, when the number of component mounting machines is changed, the length of the mounting line is thereby also changed, and there may be a drawback such that the change in the number or the length cannot be dealt with by the cableveyor. In addition, there have also been fears that a cable may interfere with work.

The present disclosure has been made in order to solve the problems described above, and a main object of the disclosure is to enable a transmission to be made from a management device to a mobile work machine without any problem even though the length of a mounting line is changed.

Solution to Problem

According to the present disclosure, there is provided a component mounting system including:
a mounting line in which multiple component mounting machines, each including a component supply device, are arranged along a predetermined direction;
a mobile work device, being configured to move along the predetermined direction, which at least replenishes or collects the component supply device to or from each component mounting machine; and
a management device configured to transmit a signal to the mobile work device via a communication path,
wherein the communication path is an optical wireless communication path provided along the predetermined direction.

In this component mounting system, the management device transmits a signal to the mobile work device via the optical wireless communication path provided along the predetermined direction which is the direction in which the component mounting devices are arranged. That is, a signal can be transmitted from the management device to the mobile work device without using a cable. As a result, even though the length of the mounting line is changed due to a change in the number of component mounting machines constituting the mounting line, the transmission of a signal from the management device to the mobile work device can be performed without any problem.

DESCRIPTION OF EMBODIMENTS

Figure 1:
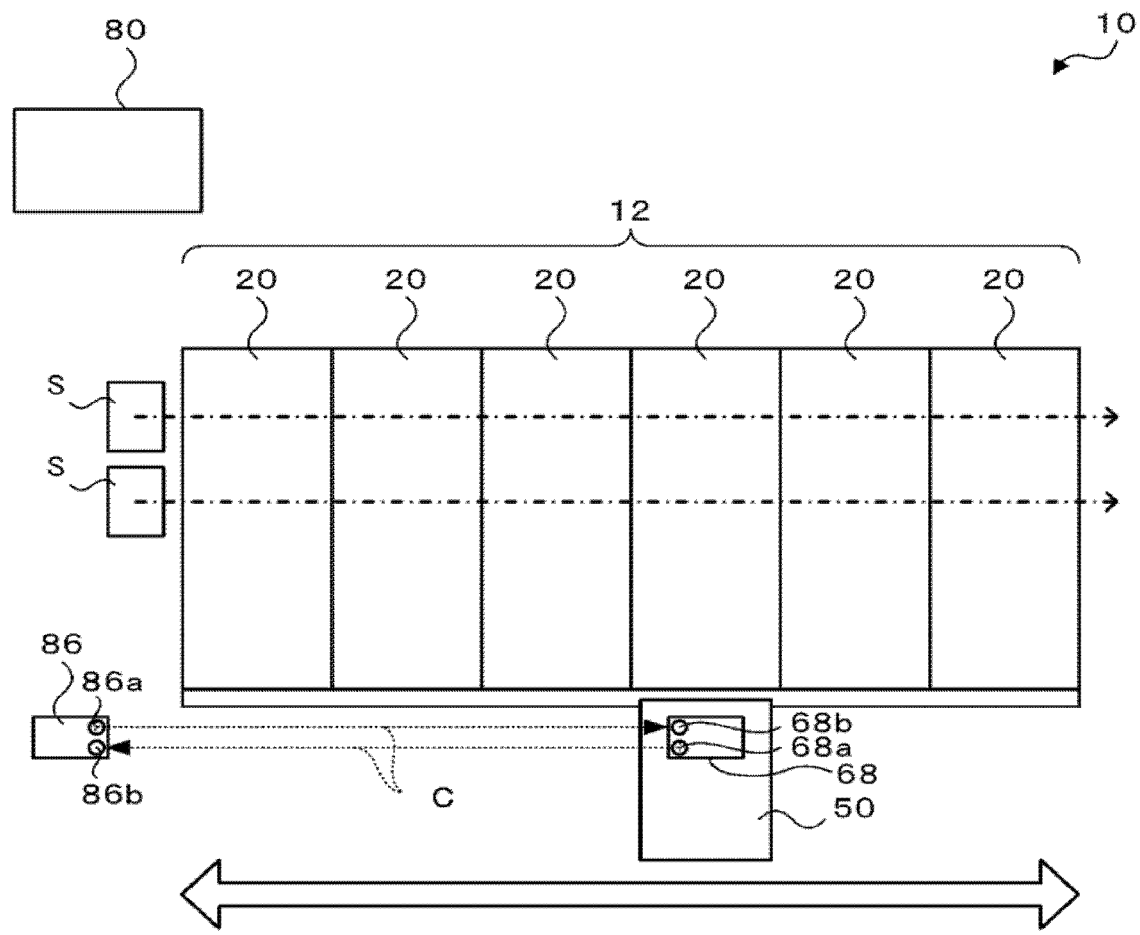
FIG. 1 is a plan view illustrating a schematic configuration of component mounting system 10.
Figure 2:
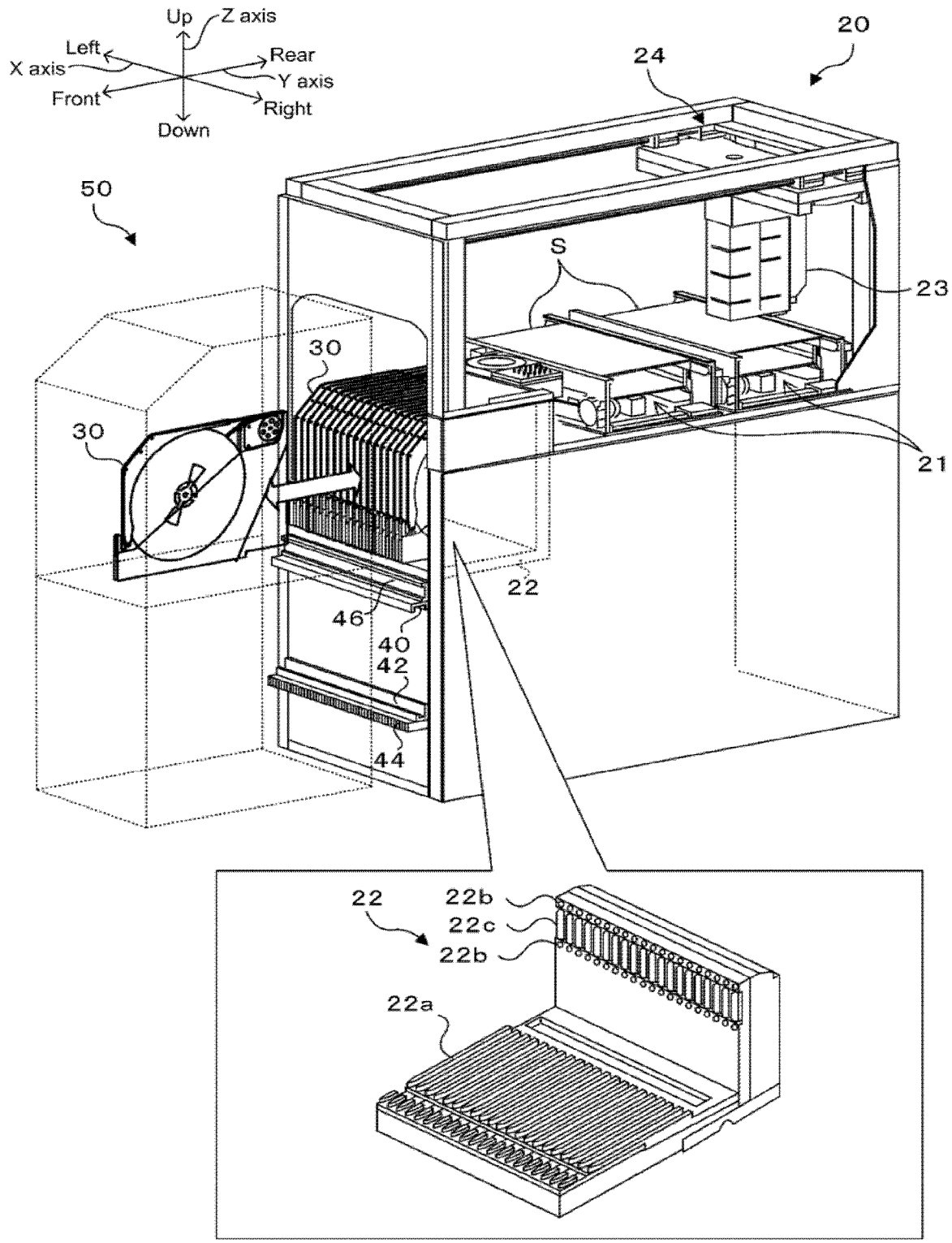
FIG. 2 is a perspective view illustrating schematic configurations of component mounting machine 20 and loader 50.
Figure 3:
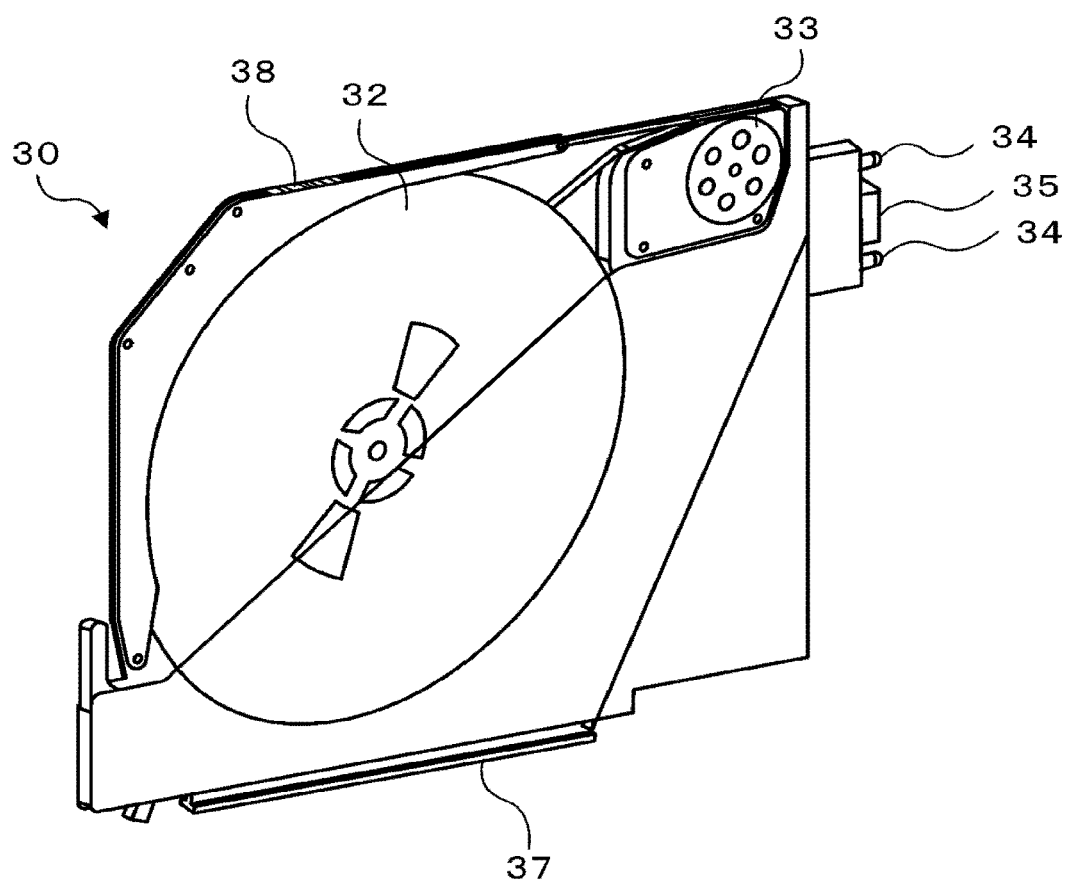
FIG. 3 is a perspective view illustrating a schematic configuration of feeder 30.
Figure 4:
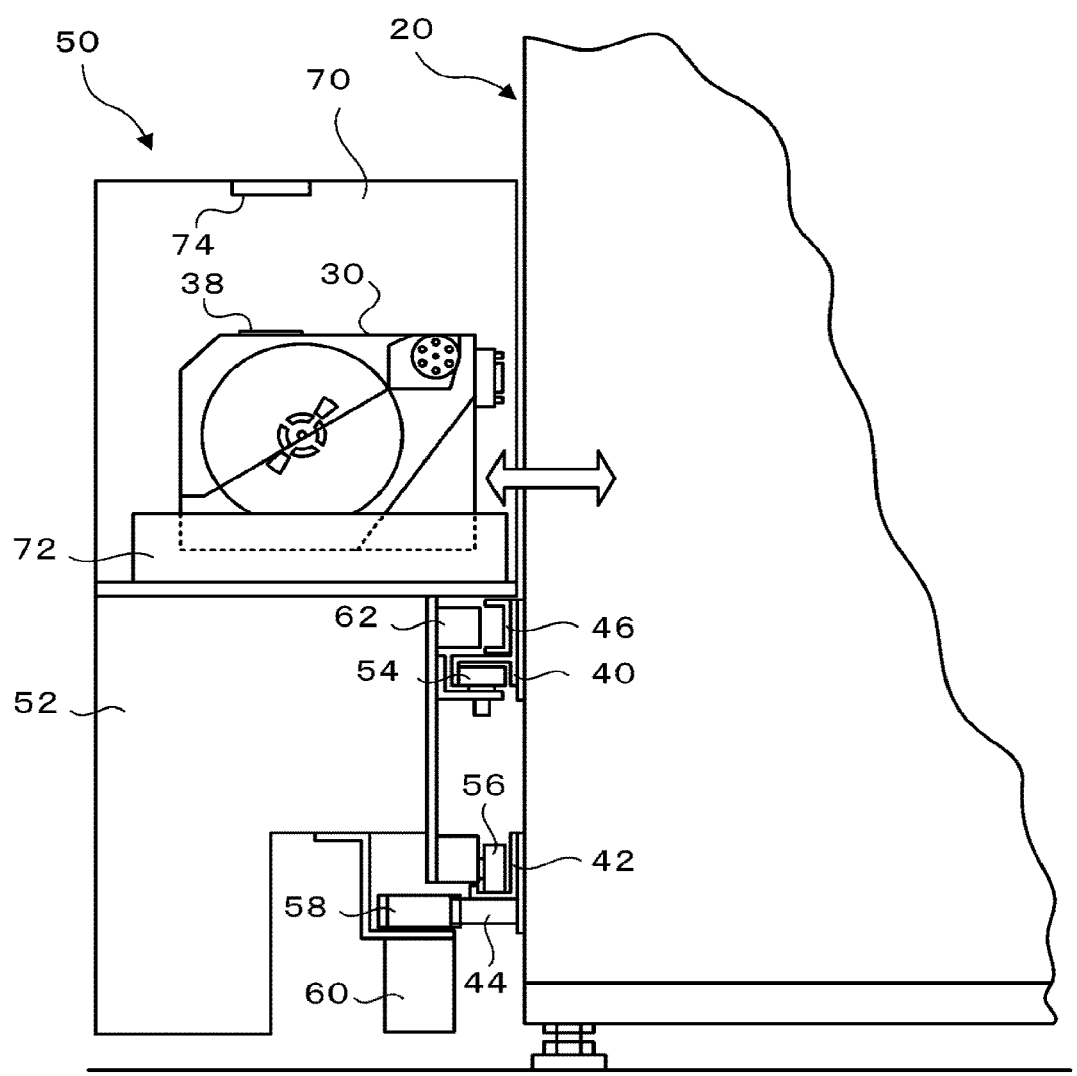
FIG. 4 is a side view illustrating the schematic configurations of component mounting machine 20 and loader 50.
Figure 5:
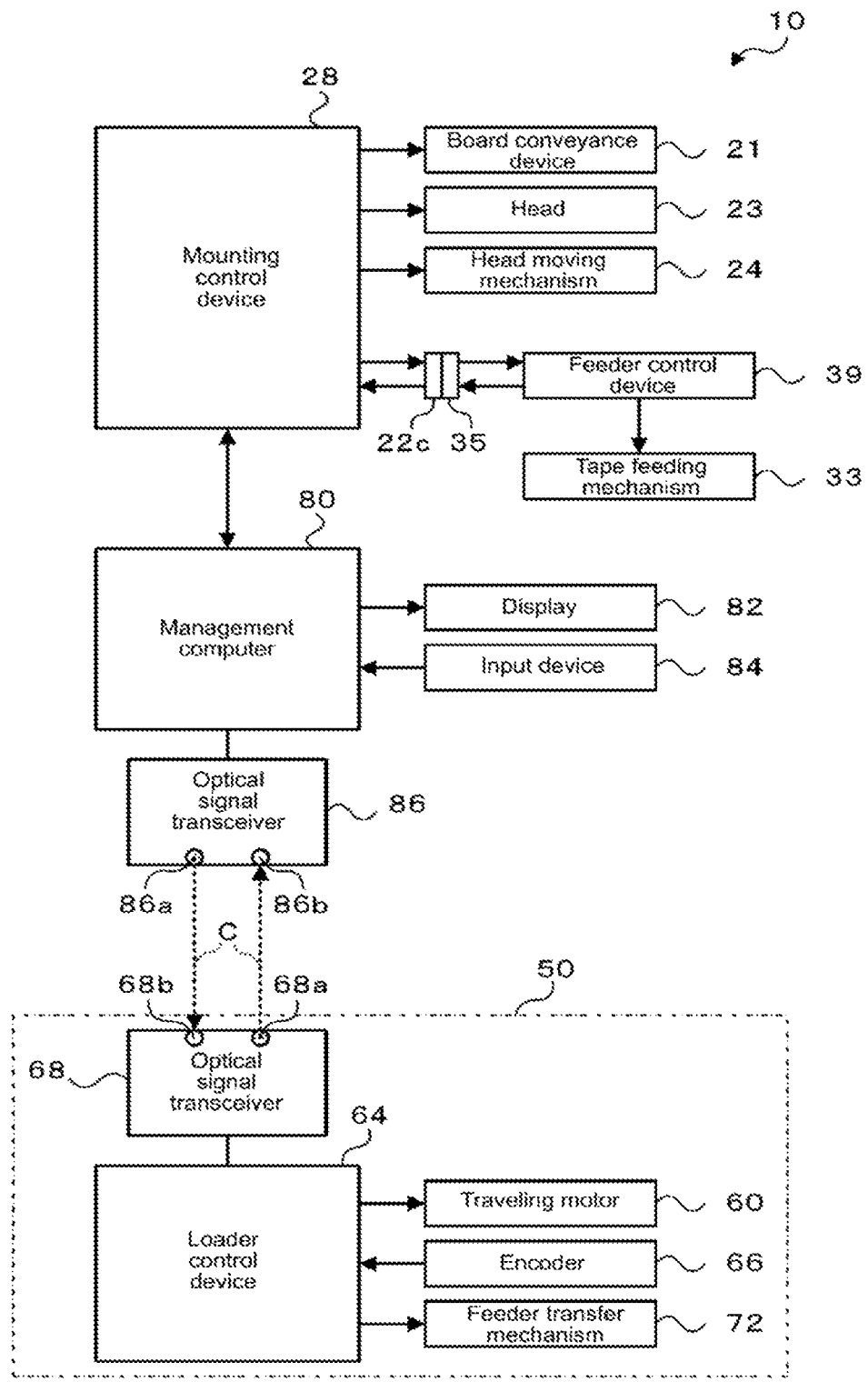
FIG. 5 illustrates electrical connections in component mounting system 10.

Hereinafter, referring to drawings, preferred embodiments of a component mounting system of the present disclosure will be described. FIG. 1 is a plan view illustrating a schematic configuration of component mounting system 10, FIG. 2 is a perspective view illustrating schematic configurations of component mounting machine 20 and loader 50, FIG. 3 is a perspective view illustrating a schematic configuration of feeder 30, FIG. 4 is a side view illustrating the schematic configurations of component mounting machine 20 and loader 50, and FIG. 5 is illustrates electrical connections in component mounting system 10. In FIG. 1, a left-right direction is an X-direction, a front-rear (near side-far-side) direction is a Y-direction, and an up-down direction is a Z-direction.

Component mounting system 10 includes mounting line 12, loader 50, and management computer 80.

As shown in FIG. 1, mounting line 12 is formed by aligning multiple component mounting machines 20 along the X-direction. Board S is conveyed rightwards after board S is conveyed into leftmost component mounting machine 20 and is then conveyed out from rightmost component mounting machine 20. Therefore, a left side of mounting line 12 is referred to as an upstream side, and a right side thereof is referred to as a downstream side. In the present embodiment, for example, component mounting machine 20 is described as a component mounting machine of a type in which boards S are conveyed in two front and rear rows, but the present disclosure is not limited to this type.

As shown in FIG. 2, component mounting machine 20 includes board conveyance devices 21, feeder table 22, head 23, and head moving mechanism 24. Board conveyance device 21 conveys a board S in the X-direction. Feeder table 22 is a table that is L-shaped in a side view and is provided on a front surface of component mounting machine 20. This feeder table 22 includes multiple slots 22a aligned in the X-direction, and connector 22c provided between two upper and lower positioning holes 22b. Head 23 include a nozzle configured to pick up a component supplied to a predetermined component supply position by feeder 30 by means of negative pressure and release the picked up component by means of positive pressure. Head moving mechanism 24 moves head 23 in the X- and Y-directions. In addition, component mounting machine 20 includes mounting control device 28 (refer to FIG. 5) configured to control the whole of the system. Mounting control device 28 is made up of known CPU, ROM, HDD, RAM, and the like and outputs drive signals to board conveyance device 21, head 23, head moving mechanism 24, and the like.

Feeder 30 is configured as a tape feeder configured to feed out a tape having components installed thereon at a predetermined pitch. As shown in FIG. 3, feeder 30 includes tape reel 32, tape feeding mechanism 33, connector 35, rail member 37, and bar code 38. Tape reel 32 holds the tape wound therearound. In the tape, components are installed in multiple recessed sections provided on a tape surface. Tape feeding mechanism 33 pulls out the tape from tape reel 32 and feeds out the tape to a predetermined component supply position where the nozzle can pick up a component. Connector 35 is provided between two projecting positioning pins 34. Rail member 37 is a member having a shape extending in the Y-direction on lower end face of feeder 30. Bar code 38 includes, as information, a serial ID that can specify a type of components (a component type) installed on tape reel 32 and is provided on an upper surface of feeder 30. When feeder 30 is set on feeder table 22, rail member 37 of feeder 30 is inserted from the front to the rear along slot 22a of feeder table 22. When the insertion is completed, two positioning pins 34 of feeder 30 fit into two positioning holes 22b of feeder table 22, and at the same time, connector 35 of feeder 30 fits into connector 22c of feeder table 22, whereby both connectors 35, 22c are electrically connected. When feeder 30 is removed from feeder table 22, a procedure opposite to the setting procedure is performed. Feeder 30 includes feeder control device 39 (refer to FIG. 5) configured to control the whole of the feeder. Feeder control device 39 includes known CPU, ROM, RAM, and the like and outputs a drive signal to tape feeding mechanism 33. Feeder control device 39 can communicate with mounting control device 28, management computer 80, and the like via connectors 35, 22c.

As shown in FIGS. 2 and 4, upper guide rail 40, lower guide rail 42, rack gear 44, and non-contact power supply coil 46 are provided on the front surface of component mounting machine 20. Upper guide rail 40 is a rail extending in the X-direction and having a U-shaped cross section and has an opening portion facing downward. Lower guide rail 42 is a rail extending in the X-direction and having an L-shaped cross section and has a perpendicular surface attached to the front surface of component mounting machine 20 and a horizontal surface extending forward. Rack gear 44 is a gear extending in the X direction and having multiple vertical grooves carved on a front surface thereof. Non-contact power supply coil 46 is a coil arranged along the X-direction. Upper guide rail 40, lower guide rail 42, and rack gear 44 of component mounting machine 20 can detachably be coupled to upper guide rail 40, lower guide rail 42, and rack gear 44 of adjacent component mounting machine 20. Therefore, component mounting machine 20 is standardized, and the number of component mounting machines 20 arranged on mounting line 12 can be increased or decreased.

As shown in FIG. 4, loader 50 is configured in two upper and lower stages, the lower stage being traveling table 52, and the upper stage being feeder storage unit 70.

Traveling table 52 includes upper roller 54, lower roller 56, pinion gear 58, traveling motor 60, and non-contact power receiving coil 62. Upper roller 54 is inserted upwardly from an opening section of upper guide rail 40 and is supported in such a manner as to be brought into rolling engagement with a side wall of upper guide rail 40. Lower roller 56 is supported in such a manner as to be brought into rolling engagement with a horizontal surface of lower guide rail 42. Pinion gear 58 is caused to mesh with rack gear 44. A motor shaft of traveling motor 60 is connected to a rotational shaft of pinion gear 58. When pinion gear 58 meshing with rack gear 44 extending in the X-direction is rotated by traveling motor 60, traveling table 52 and hence loader 50 move in the X-direction while upper roller 54 is rolling on the side wall of upper guide rail 40 and lower roller 56 is rolling on the horizontal surface of lower guide rail 42. On the other hand, non-contact power receiving coil 62 faces non-contact power supply coil 46 of component mounting machine 20 with a predetermined space maintained from non-contact power receiving coil 46 and receives electric power necessary for traveling or other operations of loader 50 from component mounting machine 20. Non-contact power receiving coil 62 may charge a battery (not shown) with the electric power received from component mounting machine 20 for use for traveling or other operations of loader 50.

As shown in FIG. 5, traveling table 52 includes further loader control device 64, encoder 66, and optical signal transceiver 68. Loader control device 64 is made up known CPU, ROM, HDD, RAM, and the like. Encoder 66 detects a position of loader 50 in the X-direction and outputs the detected position to loader control device 64. Optical signal transceiver 68 includes light emitting element 68a and light receiving element 68b and is connected to loader control device 64.

Feeder storage unit 70 stores feeders 30 with which component mounting machines 20 are replenished and also stores feeders 30 that are collected from component mounting machines 20. Feeder storage unit 70 includes feeder transfer mechanism 72 and bar code reader 74. Feeder transfer mechanism 72 supplies feeders 30 for replenishment and collects feeders 30 for collection. Specifically, when replenishing component mounting machine 20 with feeder 30, feeder transfer mechanism 72 clamps and moves feeder 30 stored in feeder storage unit 70 to the rear along a Y-axis and inserts feeder 30 in question into empty slot 22a in feeder table 22 in component mounting machine 20. Additionally, when collecting feeder 30 from component mounting machine 20, feeder transfer mechanism 72 clamps and moves feeder 30 held feeder table 22 in component mounting machine 20 to the front along the Y-axis to pull the feeder 30 in question from feeder table 22 and stores the feeder 30 in question back into feeder storage unit 70. Power required for feeder transfer mechanism 72 is supplied from component mounting machine 20 via non-contact power supply coil 46. Bar code reader 74 reads bar code 38 of feeder 30 so stored back in feeder storage unit 70 and outputs information so read to loader control device 64.

Management computer 80 is made up of known CPU, ROM, HDD, RAM, and the like and includes display 82 such as LCD and input device 84 such as a keyboard and a mouse as shown in FIG. 5. HDD of management computer 80 stores production job data. The production job data determines which components are mounted on a board S in which order in each component mounting machine 20 and how many boards S with the components so mounted are produced. Management computer 80 is connected with mounting control device 28 of each component mounting machine 20 by wire so as to enable bidirectional communication therebetween. Management computer 80 is connected with optical signal transceiver 86 including light emitting element 86a and light receiving element 86b. As shown in FIG. 1, optical signal transceiver 86 is fixed to an upstream end portion of mounting line 12. Light-emitting element 86a and light-receiving element 86b of optical signal transceiver 86 are connected with light receiving element 68b and light emitting element 68a of optical signal transceiver 68 of loader control device 64, respectively, by light so as to enable a wireless communication therebetween. This wireless communication path is referred to as optical wireless communication path C. Optical wireless communication path C is provided along the X-direction (that is, the direction in which multiple component mounting machines 20 are arranged). Management computer 80 can communicate with loader control device 64 bidirectionally by way of optical wireless communication path C. As light, visible light is used, but infrared light may be used. Alternatively, laser light may be used. Since loader 50 is moved in the X-direction, loader 50 can move towards and away from optical signal transceiver 86.

Next, the operation of component mounting machine 20 will be described. Mounting control device 28 of component mounting machine 20 controls head moving mechanism 24 so that the nozzle of head 23 arrives at the component supply position of feeder 30, causing the nozzle to suction pick up a component supplied by feeder 30. Thereafter, mounting control device 28 controls head moving mechanism 24 so that the component picked up by the nozzle arrives at a predetermined mounting position on board S, causing the nozzle to release the component to be mounted at the mounting position. Mounting control device 28 performs this mounting operation on all components to be mounted on board S. In addition, mounting control device 28 performs component mounting on the number of boards S set in the production job data.

Mounting controller 28 of component mounting machine 20 subtracts the number of component removed from feeder 30 from the number of components remaining in feeder 30 each time a component is removed from feeder 30, deems that a component shortage is coming soon when the number of components remaining in the feeder becomes a predetermined threshold or smaller, and outputs a request for replenishing feeder table 22 with feeder 30 of the same type to management computer 80.

When the replenishment request is inputted into management computer 80, management computer 80 displays on display 82 a screen instructing the operator to set feeder 30 installing components of a type requested to be supplied for replenishment in feeder storage unit 70 of loader 50. After seeing this screen, the operator sets feeder 30 installing components of that type in feeder storage unit 70 of loader 50. When feeder 30 is set in feeder storage unit 70, bar code 38 of feeder 30 is read by bar code reader 74, and a serial ID of bar code 38 in question is transmitted from loader control device 64 to management computer 80 via optical wireless communication path C. Since management computer 80 stores data regarding components in association with each serial ID in the HDD, management computer 80 determines whether the type of components in feeder 30 set in loader 50 is the same as the type of components requested to be supplied for replenishment of feeder table 22. If it determines that both the types do not coincide with each other, management computer 80 reports an error. If it determines that both the types coincide with each other, management computer 80 outputs a feeder replacement request to loader control device 64 via optical wireless communication path C. The feeder replacement request is a command for loader 50 to perform a feeder replacement in component mounting machine 20 to which the replenishment request is outputted. The feeder replacement request includes positional information on slot 22a of feeder table 22 of component mounting machine 20, specifically, positional information on slot 22a into which feeder 30 to be supplied for replenishment is inserted and also positional information on slot 22a in which feeder 30 that has run out of components is kept inserted.

When the feeder replacement request is input into loader control device 64 from management computer 80 via optical wireless communication path C, loader control device 64 controls traveling motor 60 so that loader 50 arrives at a position lying ahead of component mounting machine 20 which has output the replenishment request. Specifically, traveling motor 60 is controlled so that feeder 30 set in feeder storage unit 70 comes to face slot 22a into which feeder 30 in question is to be inserted. In that state, loader control device 64 controls feeder transfer mechanism 72 so that feeder 30 set in feeder storage unit 70 is inserted into slot 22a that feeder 30 in question faces. As a result, new feeder 30 is supplied into component mounting machine 20, whereby component mounting machine 20 in question is replenished with requested feeder 30.

Thereafter, loader control device 64 controls traveling motor 60 so that a feeder recovery position in feeder storage unit 70 faces feeder 30 that has run out of components on feeder table 22. In this state, loader control device 64 controls feeder transfer mechanism 72 so that feeder 30 that has run out of components is pulled into the feeder recovery position in feeder storage unit 70. As a result, feeder 30 that has run out of components is recovered in loader 50.

In this manner, the replenishment of feeder table 22 with new feeder 30 installing the same type of components as the type of components that have been used up and the recovery of feeder 30 that has run out of components are automatically performed by loader 50. Therefore, component mounting machine 20 can continue the production without interrupting the mounting operation only by switching the component supply position of feeder 30 that has run out of components (the position where the component is suction picked up by the nozzle provided on the head 23) to a component supply position of new feeder 30.

Here, the correspondence relationship between the constituent elements of the present embodiment and constituent elements of the present disclosure will be clarified. Component mounting system 10 of the present embodiment corresponds to a component mounting system of the present disclosure, mounting line 12 corresponds to a mounting line, loader 50 corresponds to a mobile work device, management computer 80 corresponds to a management device, and optical wireless communication path C corresponds to an optical wireless communication path. In addition, feeder 30 corresponds to a component supply device.

In the component mounting system 10 described above, management computer 80 transmits a signal to loader 50 via optical wireless communication path C provided along the X-direction, which is the direction in which component mounting machines 20 are arranged. That is, a transmission from management computer 80 to loader 50 can be performed without using a cable. Therefore, even though the number of component mounting machines 20 constituting mounting line 12 is increased or decreased to thereby change the length of mounting line 12, a transmission from management computer 80 to loader 50 can be performed without any problem.

Management computer 80 is connected to an optical signal transceiver 86 fixed to an end portion of mounting line 12, and loader 50 is connected with optical signal transceiver 86 via optical wireless communication path C and moves towards and away from optical signal transceiver 86. Therefore, while loader 50 moves from an end to an end of mounting line 12, a communication can be performed between loader 50 and management computer 80 using optical wireless communication path C.

Further, loader 50 is supplied with power without contact from individual component mounting machines 20 arranged along mounting line 12. In the case where loader 50 is powered by a wire, a power supply cord may interrupt the movement of loader 50, but such a fear is eliminated since power is supplied with non-contact manner.

Furthermore, as compared with a case where communication between management computer 80 and loader control device 64 is performed via a cableveyor or a curtain cable, with the embodiment described above, noise and dust generation can be eliminated. In addition, in the case where a communication between management computer 80 and loader control device 64 is performed by wireless communication using radio waves, it is necessary to prepare a communication unit that conforms to the radio wave law of each country, but such a preparation is not necessary in the embodiment described above because optical radio communication is used.

The present disclosure is not limited in any way to the embodiment described above, and hence, needless to say, the present disclosure can be carried out in various forms without departing from the technical scope thereof.

Figure 6:
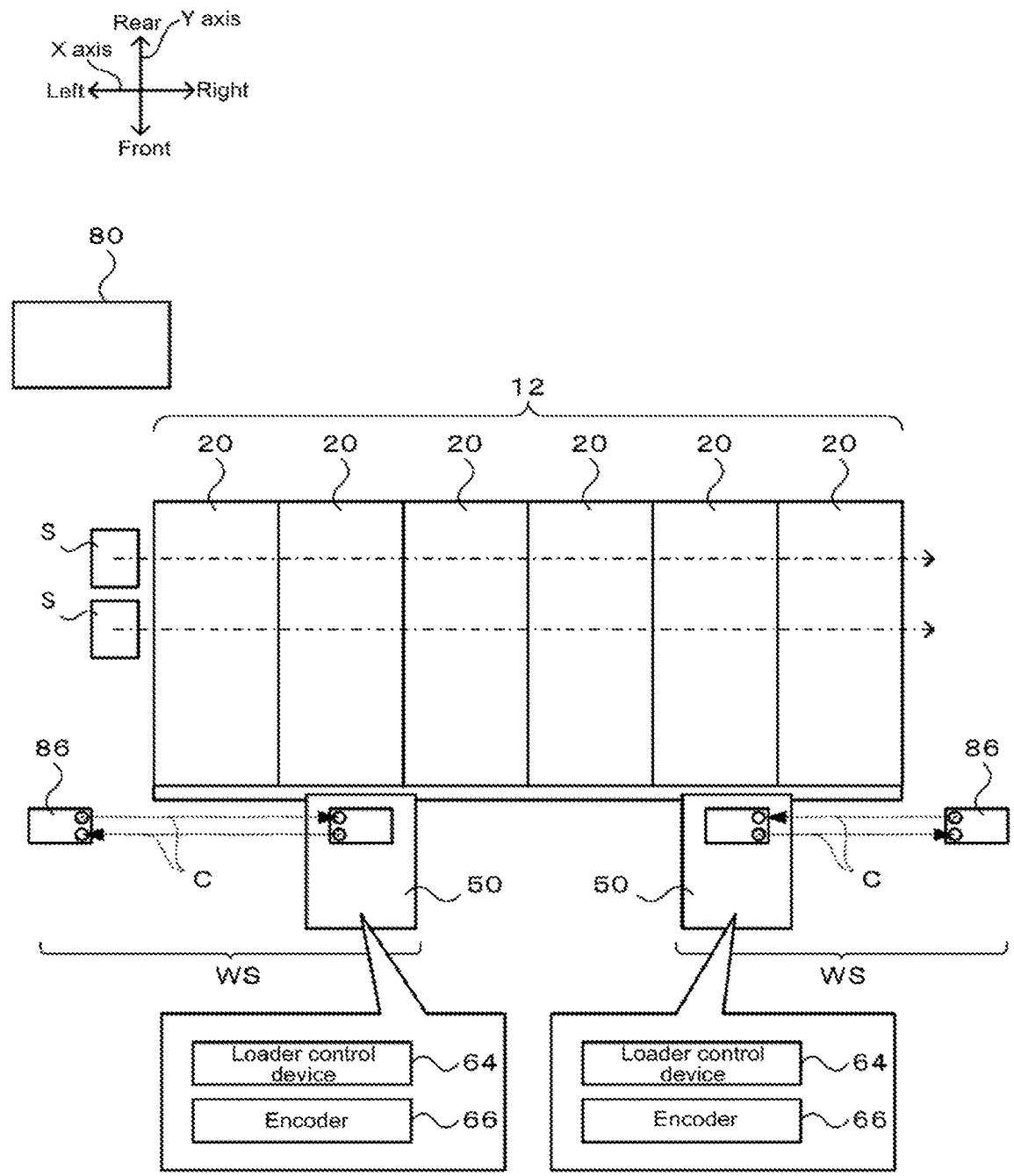
FIG. 6 is a plan view illustrating a schematic configuration of another example of a component mounting system.

For example, in the embodiment described above, one working device set including loader 50, optical signal transceiver 86, and optical wireless communication path C is provided in front of mounting line 12, but as shown in FIG. 6, the working device set WS may be provided on each of an upstream side and a downstream side of mounting line 12. In this case, upstream loader 50 performs an optical wireless communication with management computer 80 via upstream optical signal transceiver 86, and a downstream loader 50 performs an optical wireless communication with management computer 80 via downstream optical signal transceiver 86. As a result, since two loaders 50 can be used to supply feeders 30 for replenishment and recover used feeders 30 for one mounting line 12, the operation time is reduced. In FIG. 6, respective loaders 50 on the upstream and downstream sides of mounting line 12 are configured to move on the same straight line in the X-direction. Therefore, when compared with the case where two loaders 50 move on different straight lines in the X-direction, the overall configuration can be made compact. When two loaders 50 move on the same straight line in the X-direction as described above, management computer 80 preferably controls the movement of two loader 50 so that two loaders 50 are separated from each other by a predetermined inter-device distance or greater. Specifically, management computer 80 receives and monitors positions of loaders 50 in the X-direction detected by encoders 66 of loaders 50 from loader control devices 64 and transmits a command signal to loader control devices 64 so that two loaders 50 are separated from each other by the predetermined distance or greater. As a result, colliding of two loaders 50 can be avoided.

In the embodiment described above, feeder 30 is described as functioning as the component supply device, but the present disclosure is not particularly limited to feeder 30 and hence may function as, for example, a component tray or a unit for supplying a component tray. In addition, the component supply device is not limited to a device such as feeder 30 for supplying components to be mounted on board S and hence may be, for example, a device for supplying a head or a nozzle stocker for supplying a replacement nozzle for attachment to the head.

In the embodiment described above, loader 50 is described as executing both the supply of feeders 30 for replenishment and the collecting of used feeders 30, but the present disclosure is not particularly limited thereto, and hence, for example, loader 50 may be caused to execute only one of the supply and the collecting.

In the embodiment described above, as a mobile work device, loader 50 is described as traveling using traveling motor 60, but the present disclosure is not particularly limited thereto. For example, loader 50 may be an unmanned conveyance vehicle configured to travel by means of a magnetic induction action of a guide line embedded in a floor surface.

In the embodiment described above, the power for operating loader 50 is described as being supplied from component mounting machines 20 via non-contact power supply coil 46, but the present disclosure is not particularly limited thereto. For example, a battery may be mounted on loader 50.

In the embodiment described above, the rotational motion of traveling motor 60 is converted into the linear motion using rack gear 44 and pinion gear 58, but a rotational motion of traveling motor 60 may be converted into a linear motion using a chain instead of rack gear 44 and a sprocket wheel instead of pinion gear 58.

In the embodiment described above, mounting line 12 is described as being formed by aligning multiple component mounting machines 20 side by side in the X direction, but a printing machine for printing solder on board S or a printing inspector for inspecting a printing status by the printing machine may be arranged on an upstream side of component mounting machine 20 disposed in a most upstream position. Alternatively, a component inspector for inspecting components on board S or a reflow machine for performing a reflow of solder may be disposed on a downstream side of component mounting machine 20 disposed in a most downstream position.

The component mounting system of the present disclosure may be configured as follows.

In the component mounting system of the present disclosure, the management device may be connected to an optical signal transceiver fixed to an end of the mounting line, and the mobile work device may be connected with the optical signal transceiver via the optical wireless communication path and may move towards and away from the optical signal transceiver. As a result, while the mobile work device moves from the end to the end of the mounting line, a transmission from the management device to the mobile work device can be performed by making use of using the optical wireless communication path.

In the component mounting system of the present disclosure, the work device set including the mobile work device, the optical signal transceiver, and the optical wireless communication path may be provided on each of a first end side and a second end side of the mounting line. As a result, since the work can be performed on the mounting line using the two mobile work devices, the work time can be reduced.

In the component mounting system of the present disclosure, when the work device set is provided on each of the first end side and the second end side of the mounting line, the mobile work devices on the first end side and the second end side of the mounting line may move on the same straight line in the predetermined direction. As a result, compared with a case where two mobile work devices move on separate straight lines in a predetermined direction, the overall configuration can be made compact.

In the component mounting system of the present disclosure, when the mobile work devices on the first end side and the second end side of the mounting line move on the same straight line in the predetermined direction, the management device may control the movement of each mobile work device so that the mobile work devices on the first end side and the second end side of the mounting line are separated a predetermined inter-device distance or greater from each other. As a result, a collision of the two mobile work devices can be avoided.

In the component mounting system of the present disclosure, the mounting line may increase or decrease the number of the component mounting machines.

In the component mounting system of the present disclosure, the mobile work device may be supplied with power from each of the component mounting machines that are arranged along the mounting line, the power being supplied with non-contact manner. In the case where the mobile work device is powered using a wire, there may be fears that the movement of the mobile work device is interrupted by a power supply cord; however, in the embodiment, since power is supplied with non-contact manner, there are no such fears.

INDUSTRIAL APPLICABILITY

The present disclosure can be applied to various industries where components are mounted on boards.

REFERENCE SIGNS LIST

10 component mounting system, 12 mounting line, 20 component mounting machine, 21 board conveyance device, 22 feeder table, 22*a* slot, 22*b* positioning hole, 22*c* connector, 23 head, 24 head moving mechanism, 28 mounting control device, 30 feeder, 32 tape reel, 33 tape feeding mechanism, 34 positioning pin, 35 connector, 37 rail member, 38 bar code, 39 feeder control device, 40 upper guide rail, 42 lower guide rail, 44 rack gear, 46 non-contact power supply coil, 50 loader, 52 traveling table, 54 upper roller, 56 lower roller, 58 pinion gear, 60 traveling motor, 62 non-contact power receiving coil, 64 loader control device, 66 encoder, 68 optical signal transceiver, 68*a* light emitting device, 68*b* light receiving device, 70 feeder storage unit, 72 feeder transfer mechanism, 74 bar code reader, 80 management computer, 82 display, 84 input device, 86 optical signal transceiver, 86*a* light emitting element, 86*b* light receiving element, C optical wireless communication path, WS work device set.

The invention claimed is:

1. A component mounting system comprising:
a mounting line in which multiple component mounting machines, each including a component supply device, are arranged along a predetermined direction;
a mobile work device, being configured to move along the predetermined direction, which at least replenishes or collects the component supply device to or from each component mounting machine, the mobile work device including
an encoder that detects a position of the mobile work device in the predetermined direction, and
a first optical signal transceiver; and
a management device including a second optical signal transceiver configured to transmit and receive signals to and from the first optical signal transceiver of the mobile work device via an optical wireless communication path provided along the predetermined direction, the signals including a position signal sent by the mobile work device to the management device based on the encoder.

2. The component mounting system according to claim 1, wherein the second optical signal transceiver is adjacent to an end portion of the mounting line, and
wherein the mobile work device is configured to move towards and away from the second optical signal transceiver.

3. The component mounting system according to claim 2, wherein a work device set including the mobile work device, the second optical signal transceiver, and the optical wireless communication path is provided on each of a first end side and a second end side of the mounting line.

4. The component mounting system according to claim 3, wherein the work device set provided individually on the first end side and the second end side of the mounting line are configured to move on a same straight line in the predetermined direction.

5. The component mounting system according to claim 4, wherein the management device is configured to control movements of the work device set on the first end side and the work device set on the second end side of the mounting line to be separated from each other by a predetermined inter-device distance or greater using the respective position signals.

6. The component mounting system according to claim 1, wherein the mounting line is configured such that a number of the component mounting machines can be increased or decreased.

7. The component mounting system according to claim 1, wherein the mobile work device is configured to be supplied with power from each of the component mounting machines arranged along the mounting line, the power being supplied in a non-contact manner.

8. The component mounting system according to claim 3, wherein the second optical signal transceiver of the work device set on the first end side of the mounting line faces away from the second optical signal transceiver of the work device set on the second end side of the mounting line.

* * * * *